United States Patent
Doi

(10) Patent No.: US 8,890,558 B2
(45) Date of Patent: Nov. 18, 2014

(54) TEST HEAD AND SEMICONDUCTOR WAFER TEST APPARATUS COMPRISING SAME

(75) Inventor: Atsuyuki Doi, Saitama (JP)

(73) Assignee: Advantest Corporation, Tokyo (JP)

( * ) Notice: Subject to any disclaimer, the term of this patent is extended or adjusted under 35 U.S.C. 154(b) by 393 days.

(21) Appl. No.: 13/022,861

(22) Filed: Feb. 8, 2011

(65) Prior Publication Data

US 2011/0241716 A1 Oct. 6, 2011

(30) Foreign Application Priority Data

Feb. 10, 2010 (JP) ................................. 2010-027900

(51) Int. Cl.
G01R 31/26 (2014.01)
G01R 31/28 (2006.01)

(52) U.S. Cl.
CPC ........ *G01R 31/2889* (2013.01); *G01R 31/2808* (2013.01); *G01R 31/2891* (2013.01); *G01R 31/2887* (2013.01)
USPC ............ 324/755.04; 324/755.01; 324/756.01; 324/756.03

(58) Field of Classification Search
CPC ........... G01R 31/2886; G01R 31/2887; G01R 31/2889; G01R 31/2808
USPC ................ 324/754.03–754.2, 755.01–756.07
See application file for complete search history.

(56) References Cited

U.S. PATENT DOCUMENTS

| | | | |
|---|---|---|---|
| 6,305,230 B1 * | 10/2001 | Kasukabe et al. | 73/855 |
| 6,600,334 B1 * | 7/2003 | Hembree et al. | 324/754.14 |
| 6,798,224 B1 * | 9/2004 | Hembree et al. | 324/754.12 |
| 7,746,060 B2 | 6/2010 | Doi et al. | |
| 2003/0090281 A1 * | 5/2003 | Haseyama et al. | 324/754 |
| 2003/0112001 A1 | 6/2003 | Eldridge et al. | |
| 2006/0057875 A1 | 3/2006 | Eldridge et al. | |
| 2007/0200555 A1 * | 8/2007 | Mizushima et al. | 324/158.1 |
| 2009/0237100 A1 * | 9/2009 | Namiki et al. | 324/754 |
| 2010/0079161 A1 * | 4/2010 | Endo et al. | 324/761 |
| 2010/0102837 A1 * | 4/2010 | Abe et al. | 324/754 |
| 2010/0201386 A1 * | 8/2010 | Roelvink | 324/754 |

FOREIGN PATENT DOCUMENTS

| | | |
|---|---|---|
| JP | 2007-116085 | 5/2007 |
| JP | 2009-047466 | 3/2009 |
| TW | 200741212 | 11/2007 |
| WO | 2007/057990 | 5/2007 |
| WO | WO 2007077807 A1 * | 7/2007 |
| WO | 2007/094034 | 8/2007 |

OTHER PUBLICATIONS

U.S. Appl. No. 13/003,953 to Takayuki Yano, filed Jan. 13, 2011.
Taiwan Office action, mail date is Jul. 9, 2013.

(Continued)

*Primary Examiner* — Huy Q Phan
*Assistant Examiner* — Adam Clarke
(74) *Attorney, Agent, or Firm* — Greemblum & Bernstein, P.L.C.

(57) ABSTRACT

Providing a test head capable of suppressing a probe card from bending.

The test head 40 comprises: a test head main body 51 having a frame 51; an interface apparatus 60 electrically connecting a probe card 20 and the test head main body 50 with each other; and a brake unit 80 positioned between the probe card 20 and the frame 51 to transmit a pressing force F applied to the probe card 20 to the frame 51.

16 Claims, 19 Drawing Sheets

(56) References Cited

OTHER PUBLICATIONS

Japan Office action, mail date is Apr. 1, 2014.
Taiwan Office action, mail date is Jan. 10, 2014.
Japan Office action, mail date is Dec. 24, 2013.
Taiwan Office action, mail date is Jul. 24, 2014.

* cited by examiner

TEST HEAD AND SEMICONDUCTOR WAFER TEST APPARATUS COMPRISING SAME

TECHNICAL FIELD

The present invention relates to a test head used for testing semiconductor wafers and to a semiconductor wafer test apparatus comprising the test head.

BACKGROUND ART

An electronic component test apparatus is known in which, in order to suppress a probe card from bending due to a pressing force transmitted via a semiconductor wafer, a HIFIX is provided with a contact mechanism for receiving such pressing force in the back surface of the probe card (refer to Patent Document 1, for example).

PRIOR ART DOCUMENTS

Patent Documents

[Patent Document 1] International Publication No. 2007/057990

SUMMARY OF THE INVENTION

Problems to be Solved by the Invention

In the above electronic component test apparatus, the head plate of a prober and the top plate of the HIFIX are coupled with each other, and therefore the pressing force received by the probe card is finally transmitted to the head plate. As a consequence, if large pressing force is applied to the probe card, then the force causes the head plate to bend via the HIFIX thereby resulting in that the probe card is also possibly bent. Particularly in the case where the probe card comes to be large and/or of increased pins, the pressing force applied to a semiconductor wafer increases thereby significantly bend the probe card.

The problem to be solved by the present invention is to provide a test head capable of suppressing a probe card from bending and a semiconductor wafer test apparatus comprising such a test head.

Means for Solving the Problems

The test head according to the present invention is a test head comprising: a test head main body having a frame; and an interface apparatus electrically connecting a probe card and the test head main body with each other, characterized in that the test head further comprises a transmitting device positioned between the probe card and the frame to transmit a pressing force applied to the probe card to the frame.

In the above invention, the test head may further comprise: a holding mechanism provided at a top plate of the interface apparatus to hold the probe card; and a limiting means provided at the top plate to limit a movement of the holding mechanism in a direction departing from the probe card, and the transmitting means may have: a contact part being movable relative to either one of the limiting means or the frame and contacting other of the limiting means or the frame; and a lock mechanism provided at either one of the limiting means or the frame to lock a relative movement of the contact part.

In the above invention, the test head may further comprise a holding mechanism provided at a top plate of the interface apparatus to hold the probe card, and the transmitting means may have: a contact part being movable relative to either one of the top plate or the frame and contacting other of the top plate or the frame; and a lock mechanism provided at either one of the top plate or the frame to lock a relative movement of the contact part.

In the above invention, the test head may further comprise a holding mechanism provided at a top plate of the interface apparatus to hold the probe card, and the transmitting means may have: a contact part being movable relative to either one of the holding mechanism or the frame and contacting other of the holding mechanism or the frame; and a lock mechanism provided at either one of the holding mechanism or the frame to lock a relative movement of the contact part.

In the above invention, the holding mechanism may grasp a clamp head provided at a center portion of the probe card.

In the above invention, the transmitting means may have: a contact part being movable relative to the frame and contacting the probe card; and a lock mechanism provided at the frame to lock a relative movement of the contact part.

In the above invention, the contact part may be positioned at an inner side than a coupling portion of the top plate to be coupled with a head plate of a prober.

In the above invention, the transmitting means may have a biasing means biasing the contact part.

In the above invention, the lock mechanism may accept a relative movement of the contact part before the test head main body is positioned relative to a prober, and the lock mechanism may lock the relative movement of the contact part after the test head main body is positioned relative to the prober.

The semiconductor wafer test apparatus according to the present invention is characterized by comprising the above test head and a prober pressing a semiconductor wafer to the probe card.

Advantageous Effect of the Invention

According to the present invention, there is involved a transmitting means provided between the probe card and the frame to transmit a pressing force applied to the probe card to the frame of the test head main body, and therefore the probe card is suppressed from bending.

EMBODIMENTS FOR CARRYING OUT THE INVENTION

Below, embodiments of the present invention will be explained based on the drawings.

Figure 1:
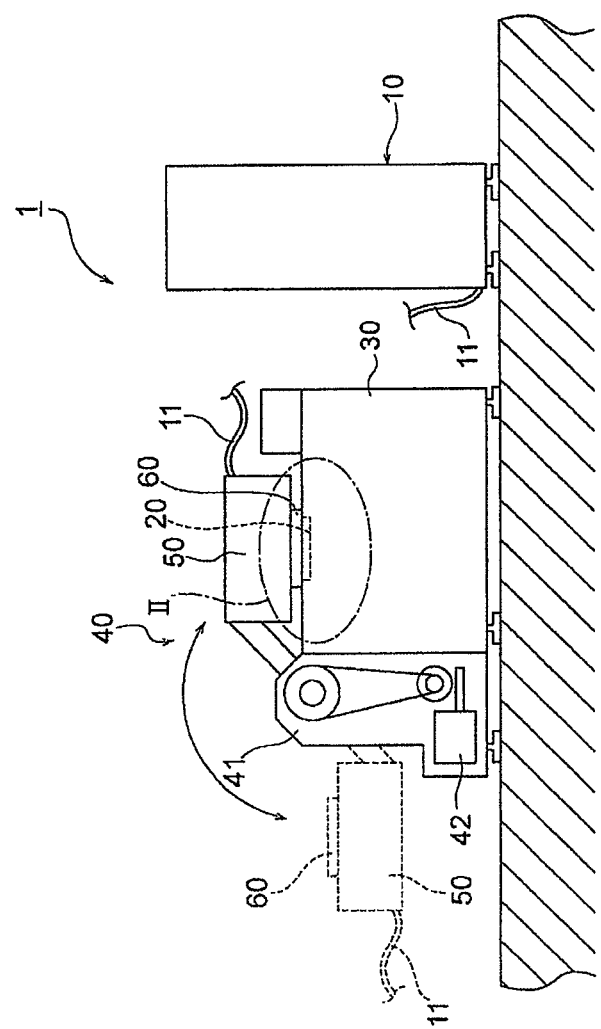
FIG. 1 is a schematic side elevational view illustrating a semiconductor wafer test apparatus according to an embodiment of the present invention.
Figure 2:
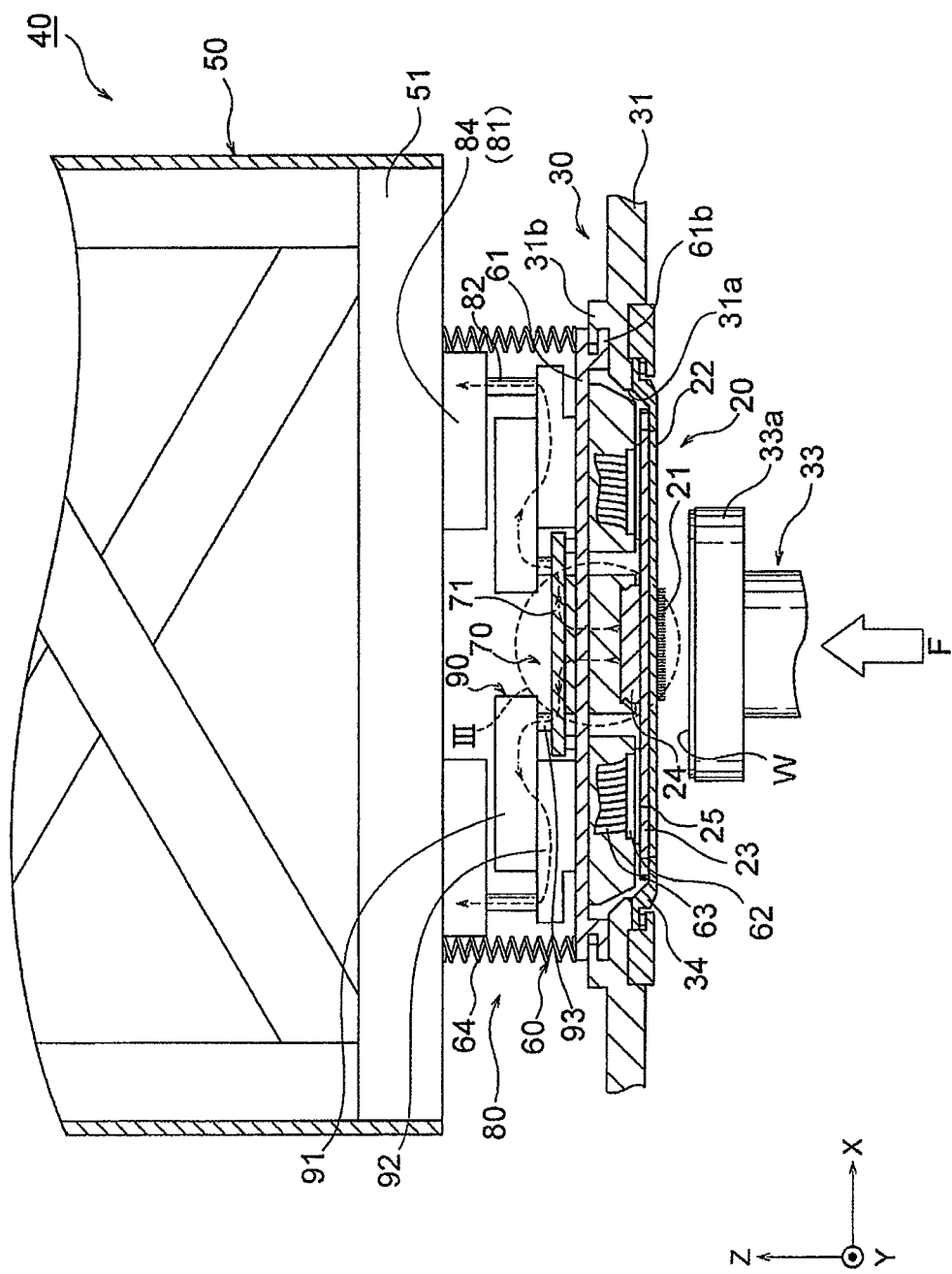
FIG. 2 is an enlarged cross sectional view of a part II of FIG. 1.
Figure 3:
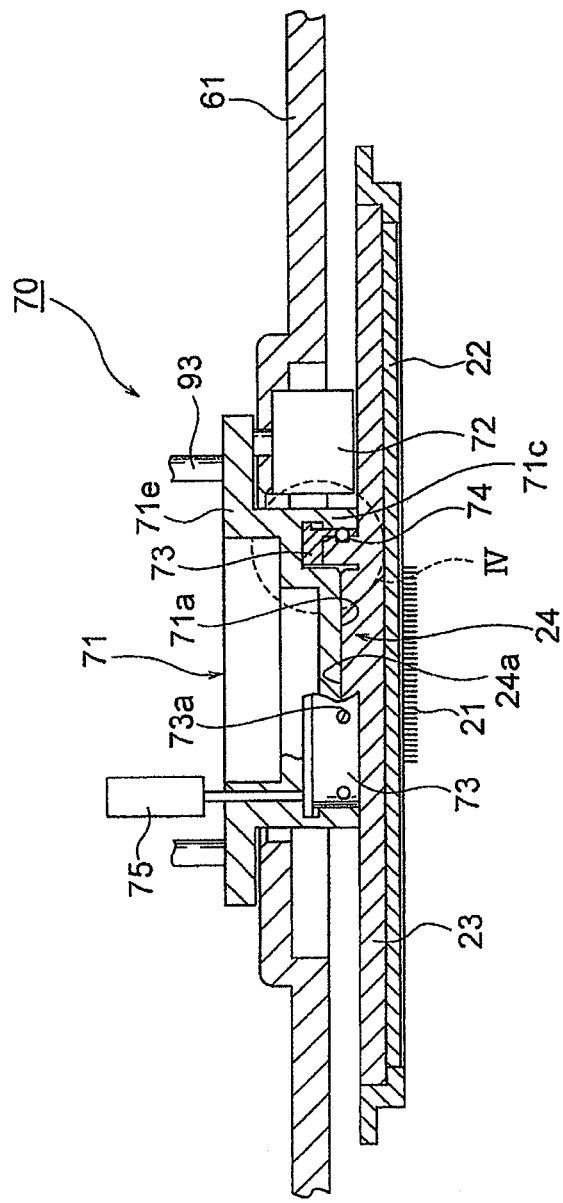
FIG. 3 is an enlarged cross sectional view of a part III of FIG. 2.
Figure 4:
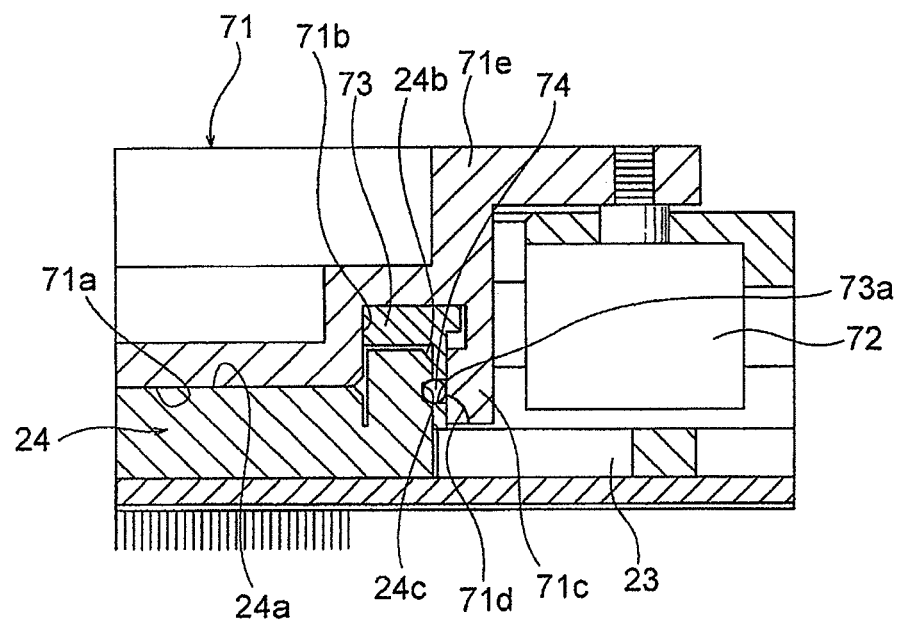
FIG. 4 is an enlarged cross sectional view of a part IV of FIG. 3.

FIG. 1 is a schematic side elevational view illustrating a semiconductor wafer test apparatus according to an embodiment, FIG. 2 is an enlarged cross sectional view of a part II of FIG. 1, FIG. 3 is an enlarged cross sectional view of a part III of FIG. 2, and FIG. 4 is an enlarged cross sectional view of a part IV of FIG. 3.

The semiconductor wafer test apparatus 1 according to the present embodiment, which is an apparatus for testing electrical characteristics of DUTs (Devices Under Test) such as integrated circuit elements created on and/or in a semiconductor wafer W, comprises a tester 10, a probe card 20, a prober 30, and a test head 40, as shown in FIG. 1.

In this semiconductor wafer test apparatus 1, as shown in FIG. 1, the tester 10 and test head 40 are electrically connected with each other via a cable 11, and the probe card 20 is attached to the test head 40. During operation, in the status where the prober 30 presses the semiconductor wafer W to the probe card 20 to establish electrical connections therebetween, the tester 10 communicates test signals with the semiconductor wafer W via the test head 40 and probe card 20 thereby to perform tests for DUTs having been created on and/or in the semiconductor wafer W.

The probe card 20 comprises, as shown in FIG. 2, contactors 21, a circuit board 22, a stiffener 23, a clamp head 24, and connectors 25.

The contactors 21 are terminals to contact with electrode pads on DUTs of the semiconductor wafer W, and specific examples thereof include Pogo pins, needles, bumps, and the like. These contactors 21 are mounted on the center area of lower surface of the circuit board 22 so as to face the electrode pads on the semiconductor wafer W.

In contrast, a number of connectors 25 which electrically connect the probe card 20 and a HIFIX 60 with each other are mounted on the upper surface of circuit board 22. Also on the upper surface of circuit board 22, the stiffener 23 is provided to surround these connectors 25, thereby reinforcing the probe card 20.

As shown in FIG. 2 to FIG. 4, the cylindrically clamp head 24 projecting toward the HIFIX 60 is provided at the substantially center area of the stiffener. A clamp contact surface 24a coming into closely contact with a sleeve contact surface 71a of a center clamp 70 is formed in upper portion of this clamp head 24.

In addition, at the upper portion of outer surface of the clamp head 24, as shown in FIG. 4, a taper face 24b is formed around entire circumference in order to push out steel balls 74 of center clamp 70 outward. Furthermore, at the substantially center position of outer surface of the clamp head 24, an engaging groove 24c which is engaged with the steel balls 74 of center clamp 70 is formed around entire circumference.

The prober 30 has a head plate 31 and a carrier arm 33, as shown in FIG. 2.

The head plate 31 is a plate positioned at the upper portion of the prober 30, as shown in the same figure. IN the head plate 31, an opening 31a to which the probe card 20 is attached via a holder 34 is formed. In addition, around the opening 31a of head plate 31, hook-shape coupling portions 31b which are engaged with coupling portions 61b of a top plate 61 of the HIFIX 60 are provided.

The carrier arm 33 moves the semiconductor wafer W in X and Y directions and to rotate it around Z-axis in the status where the adsorbing stage 33a adsorbs and holds the semiconductor wafer W, and therefore is capable of positioning the semiconductor wafer W relative to the probe card 20. At the time of testing the semiconductor wafer W, this carrier arm 33 presses the semiconductor wafer W to the probe card 20 with a pressing force F. This allows top ends of the contactors 21 of probe card 20 to contact with electrode pads of DUTs of the semiconductor wafer W, thereby to enable the semiconductor wafer W to be tested.

The test head 40 has, as shown in FIG. 2, a test head main body 50, the HIFIX 60, the center clamp 70, brake units 80, and limit units 90.

As shown in FIG. 2, the test head main body 50 has a box-like frame 51 as a structural member constituting the framework of test head main body 50, and a number of pin electronics cards not particularly shown are accommodated within the inner space of the frame 51. This test head main body 50 is electrically connected with the probe card 20 via HIFIX 60 as shown in FIG. 1, and is also electrically connected with the tester 10 via the cable 11. This test head main body 50 is capable of being turned over from the maintenance position (shown by broken line in FIG. 1) to the position above the head plate 31 of prober 30 by means of a manipulator 41, a motor 42 and other mechanisms.

The HIFIX 60 is an interface apparatus for electrically connecting the test head main body 50 and probe card 20 with each other. This HIFIX 60 has the top plate 61 abutting the head plate 31 of prober 30, and the lower surface of top plate 61 is provided with the hook-like coupling portions 61b to be engaged with the above-mentioned coupling portions 31b of head plate 31. Contact surfaces of the coupling portions 31b and 61b are inclined and therefore, engaging the coupling portions 31b and 61b with each other allows the HIFIX 60 to be fixed to the prober 30.

The HIFIX 60 has connectors 62 to be coupled with the connectors 25 of probe card 20. These connectors 62 are connected with the pin electronics cards (not shown) in the test head main body 50 via cables 63. As the connectors 25 and 62, ZIF connectors (ZIF: Zero Insertion Force) may be used, for example. Note that, without directly connecting the connectors 25 to the pin electronics cards via the cables 63, additional connectors may be further provided therebetween.

As shown in FIG. 2, the HIFIX 60 and the test head main body 50 are coupled with each other via springs 64, and therefore the HIFIX 60 is mechanically in a floating condition relative to the test head main body 50. In the present embodiment, as will be described later, the test head main body 50 is provided with the brake units 80, which allow, when being locked, the HIFIX 60 in the floating condition to be fixed relative to the test head main body 50.

The center clamp 70 comprises, as shown in FIG. 3 and FIG. 4, a sleeve 71, a first air cylinder 72, a slide body 73, steel balls 74, and a second air cylinder 75, thereby capable of grasping the clamp head 24 to hold the probe card 20.

The sleeve 71 is a bottom-having cylinder which has the sleeve contact surface 71*a* which contacts with the clamp contact surface 24*a* of the clamp head 24 at the bottom thereof. In addition, around the sleeve contact surface 71*a* of the sleeve 71, a circular recess 71*b* is formed to accommodate the slide body 73, and a rib 71*c* is provided at further outside of the circular recess 71*b* so as to project downward below the sleeve contact surface 71*a*. An accommodating groove 71*d* opened inwardly, which is capable of accommodating portions of the steel balls 74, is formed at the lower portion of the rib 71*c*.

As shown in FIG. 3, the upper portion of sleeve 71 is provided with a plate-like flange 71*e* expanding outwardly. The first air cylinder 72 is coupled with the lower surface of this flange 71*e*, and the upper surface of the flange 71*e* is contacted with shafts 93 of the limit units 90. Note that the first air cylinder 72 is fixed to the top plate 61 of the HIFIX 60.

As shown in FIG. 3 and FIG. 4, the slide body 73 is a ring-shaped member formed with a through hole to which the clamp head 24 is insertable, and is accommodated in the circular recess 71*b* of sleeve 71 so as to be movable relative to the sleeve 71. A plurality of accommodating holes 73*a* which are capable of accommodating respective steel balls 74 is formed with substantially equal intervals at the side surface of slide body 73. This accommodating hole 73*a* has, as shown in FIG. 4, an inner opening opened inwardly (at the side of clamp head 24) is smaller than steel ball 74 and an outer opening opened outwardly (at the side of rib 71*c* of sleeve 71) is larger than steel ball 74, and these has an inclined inner surface.

Note that the slide body 73 is coupled to the second air cylinder 75 as shown in FIG. 3 thereby to be movable up and down relative to the sleeve 71. Also this second air cylinder 75 is fixed to the top plate 61 of the HIFIX 60.

In turn, the description will be directed to the brake units 80.

Figure 5:
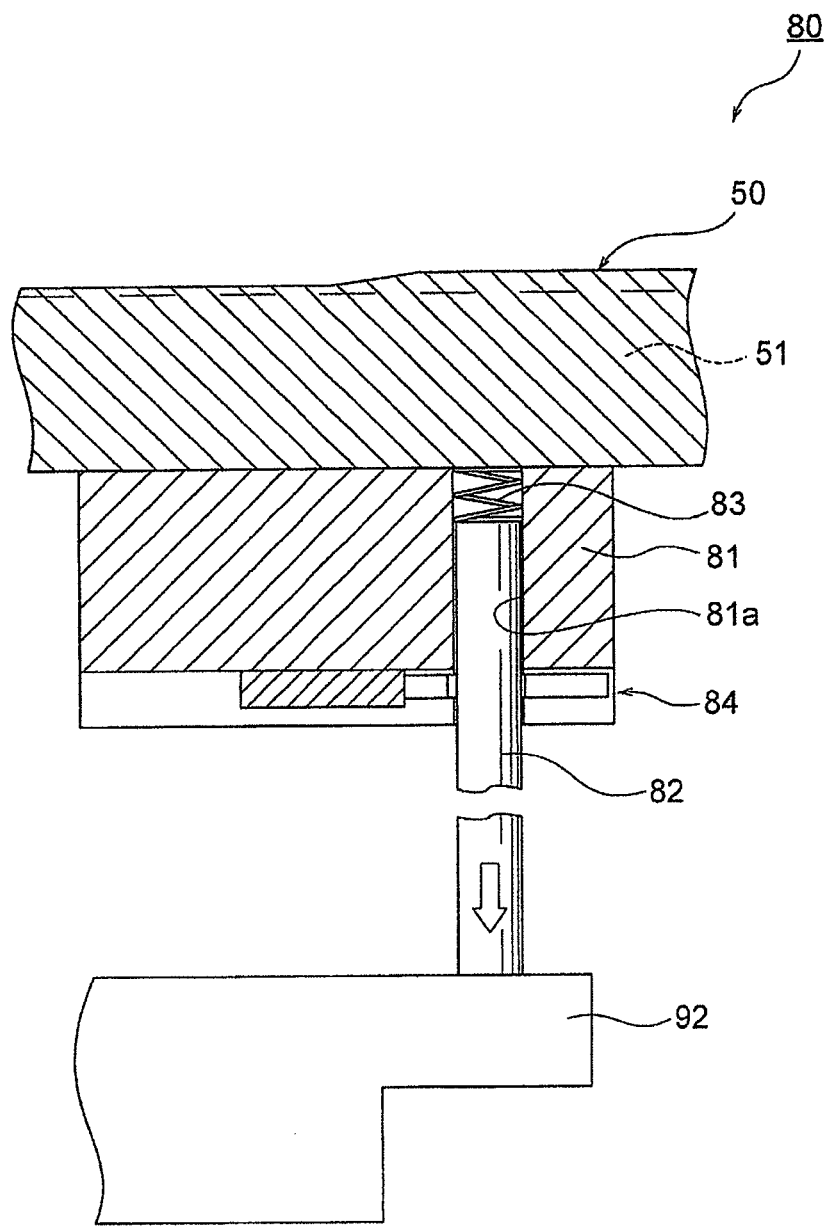
FIG. 5 is an enlarged cross sectional view of a brake unit according to an embodiment of the present embodiment.
Figure 6:
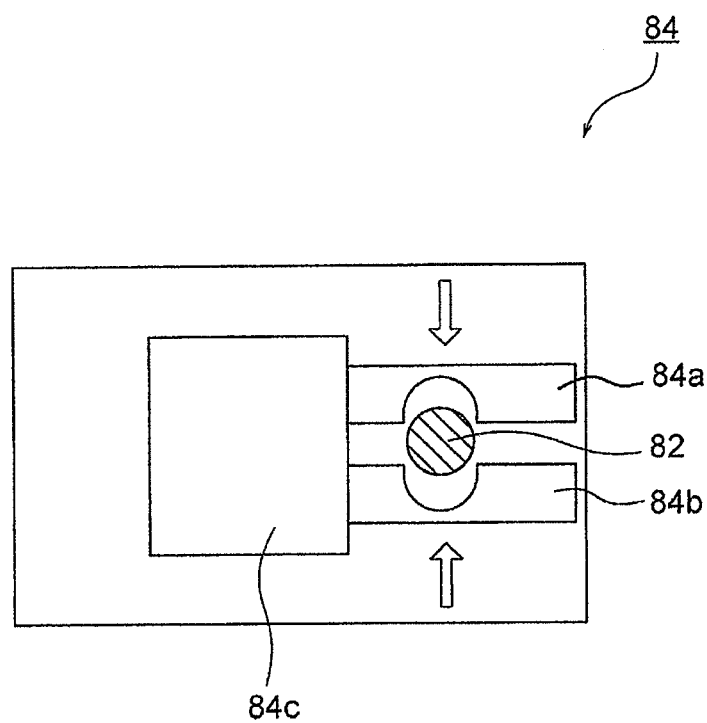
FIG. 6 is a plan view illustrating a lock mechanism of the brake unit according to an embodiment of the present invention.
Figure 7:
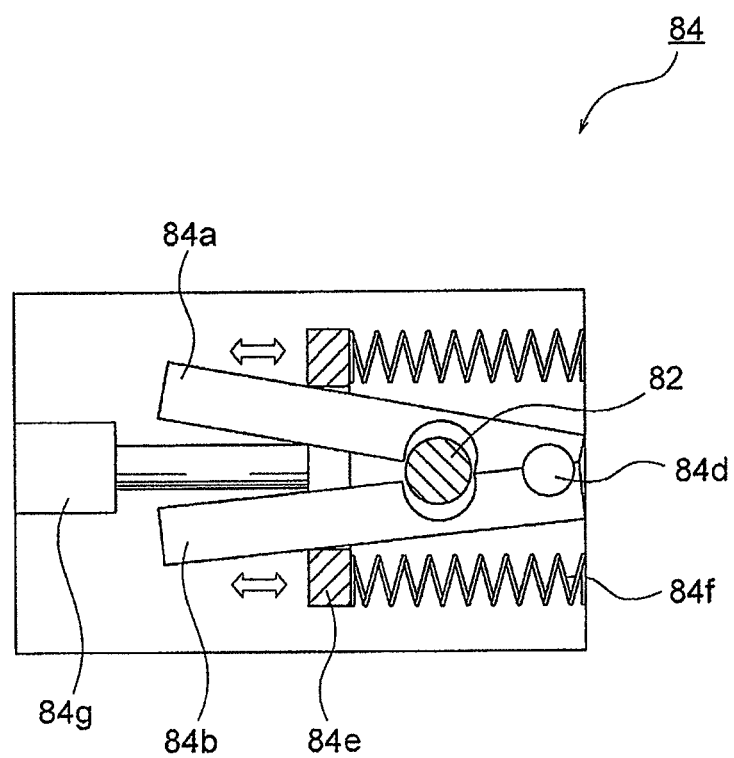
FIG. 7 is a plan view illustrating an alternative example of lock mechanism of the brake unit according to an embodiment of the present invention.
Figure 8:
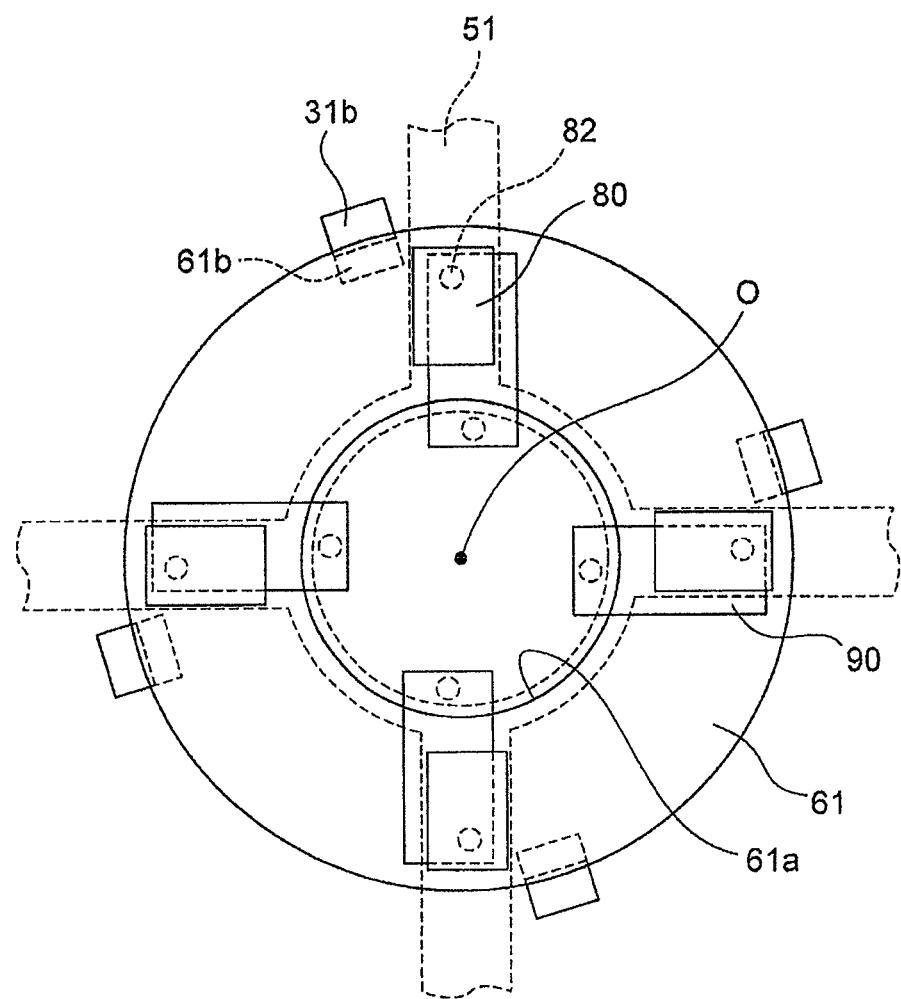
FIG. 8 is a schematic plan view illustrating an arrangement of brake units according to an embodiment of the present invention.
Figure 9:
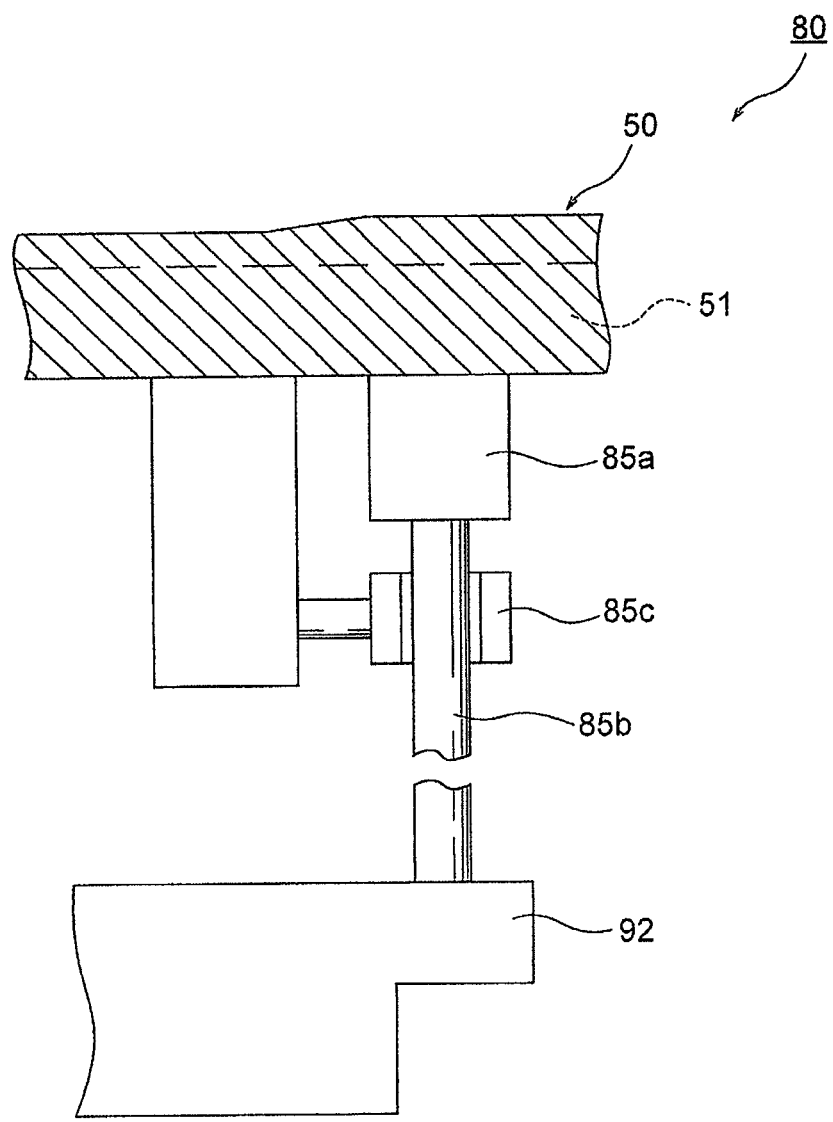
FIG. 9 is a view illustrating a first alternative example of the brake unit according to an embodiment of the present invention.
Figure 10:
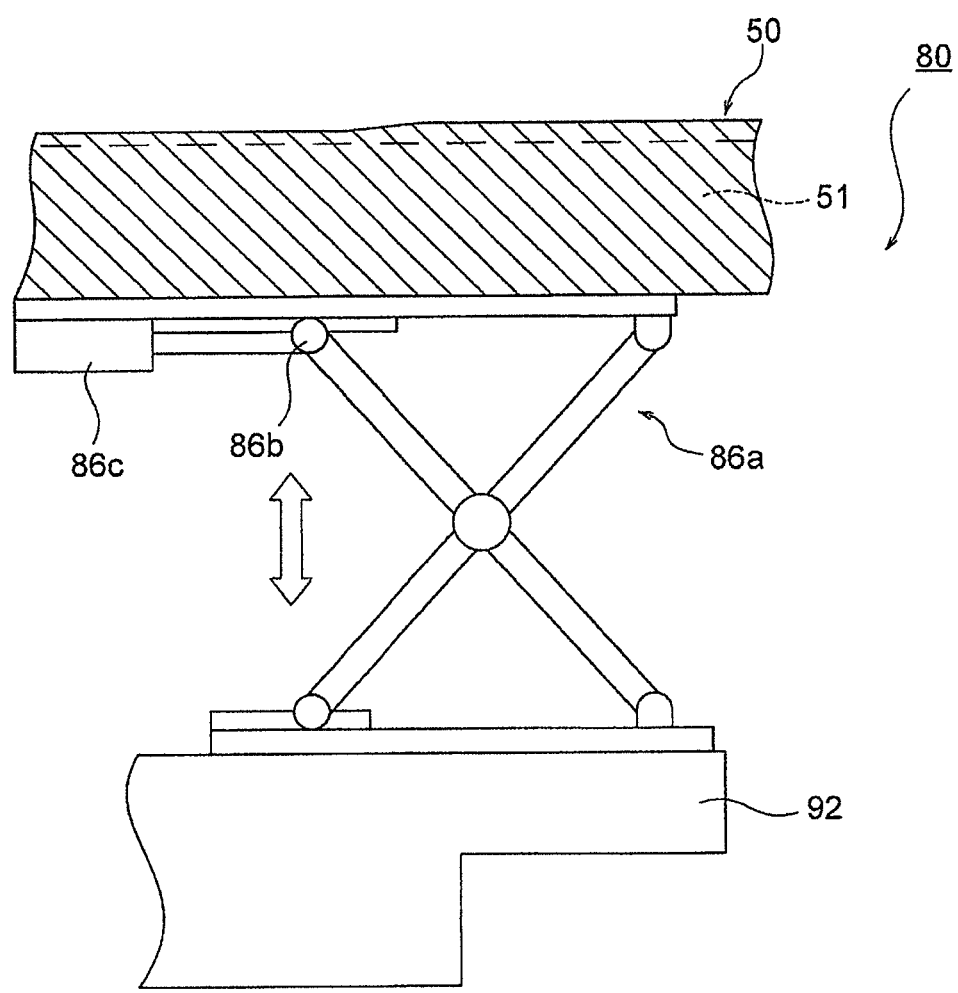
FIG. 10 is a view illustrating a second alternative example of the brake unit according to an embodiment of the present invention.
Figure 11:
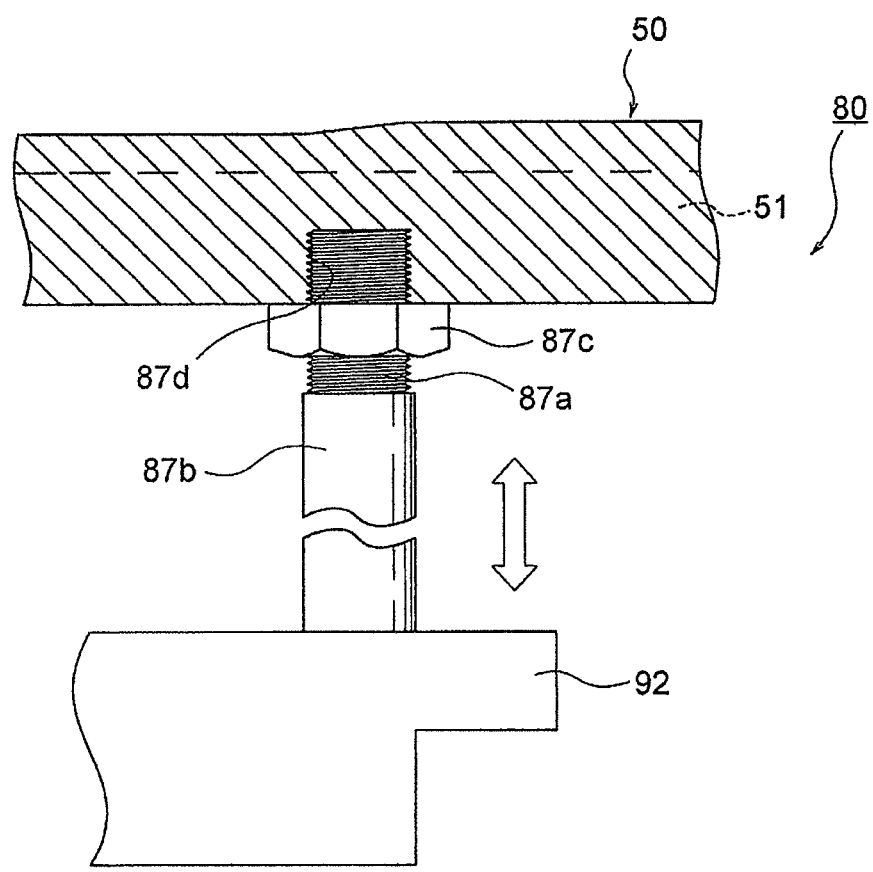
FIG. 11 is a view illustrating a third alternative example of the brake unit according to an embodiment of the present invention.

FIG. 5 is an enlarged cross sectional view of brake unit according to the present embodiment, FIG. 6 is a plan view illustrating a lock mechanism of the brake unit according to the present embodiment, FIG. 7 is a plan view illustrating an alternative example of lock mechanism of the brake unit according to the present embodiment, FIG. 8 is a schematic plan view illustrating an arrangement of brake units according to the present embodiment, and FIG. 9 to FIG. 11 are views illustrating alternative examples of the brake unit according to the present embodiment.

The brake units 80 intervene between the frame 51 of test head main body 50 and the top plate 61 of the HIFIX 60 as shown in FIG. 2, and are capable of transmitting to the frame 51 the pressing force F when the carrier arm 33 presses the semiconductor wafer W to the probe card 20.

As shown in FIG. 5, this brake unit 80 has a main body block 81, a shaft 82, an elastic member 83, and a lock mechanism 84.

As shown in the same figure, the main body block 81 is fixed to the frame 51 of test head main body 50 and sliding hole 81*a* is formed in the main body block 81. This sliding hole 81*a* is a hole in which the shaft 82 is slidable up and down in the figure. The elastic member 83 biasing the shaft 82 toward the limit unit 90 is accommodated in the sliding hole 81*a*. Although the elastic member 83 is configured of a coil-like spring in the present embodiment, the elastic member 83 is not particularly limited to this, and a plate-like spring or rubber may be alternatively used, for example.

The shaft 82 is a rod-like member partially inserted into the sliding hole 81*a* of main body block 81, and is movable relative to the frame 51. The shaft 82 contacts the supporting block 92 of the limit unit 90 in the status of being biased by the elastic member 83 in the sliding hole 81*a*.

As shown in FIG. 5, the lock mechanism 84 is a mechanism to lock the relative movement of the shaft 82. As shown in the same figure, the lock mechanism 84 locks the shaft 82 contacting the supporting block 92 to hold the shaft 82 in the status where the shaft 82 stands to extend between the frame 51 and the limit unit 90. This allows the force F received by the limit unit 90 to be transmitted to the frame 51 via the shaft 82.

As shown in FIG. 6, this lock mechanism 84 is configured of two grip arms 84*a* and 84*b* formed with respective concave portions depending on the cross sectional shape of the shaft 82 and a chuck-type air cylinder 84*c* for opening and closing the grip arms 84*a* and 84*b*. This lock mechanism 84 locks the relative movement of the shaft 82 such that the chuck-type air cylinder 84*c* causes the grip arms 84*a* and 84*b* to be closed for grasping the shaft 82. This lock mechanism 84 is capable of maintaining the locking of the shaft 82 even though 100 kg or more weight is applied to the shaft 82.

It is to be noted that the lock mechanism 84 of brake unit 80 is not limited to the above structure. For example as shown in FIG. 7, the lock mechanism 84 may be configured of two grip arms 84*a* and 84*b*, a pivot axis 84*d*, a ring-like member 84*e*, an elastic member 84*f*, and an air cylinder 84*g*.

In this case, the two grip arms 84*a* and 84*b* are coupled to be pivotally movable by the pivot axis 84*d* and inserted into the ring-like member 84*e*. The elastic member 84*f* biases the ring-like member 84*e* in the direction where the ring-like member 84*e* departs from the pivot axis 84*d* (leftward in the figure), and the air cylinder 84*g* presses the ring-like member 84*e* in the opposite direction (rightward in the figure) by being supplied with air.

In such a lock mechanism 84, if the shaft 82 is locked, the elastic member 84*f* biases the ring-like member 84*e* to move into the opposite direction from the pivot axis 84*d*. This allows the two grip arms 84*a* and 84*b* to be pressed by the inner face of the ring-like member 84*e* to come close with each other thereby locking the shaft 82. Thus, the elastic member 84*f* enables the shaft 82 to be locked without air supply in the locking status, and the locking status is stably maintained.

On the other hand, if the shaft 82 is unlocked by the lock mechanism 84, the air cylinder 84*g* is supplied with air to move the ring-like member 84*e* toward the pivot axis 84*d*. This allows the grip arms 84*a* and 84*b* to be free from the press by the inner face of the ring-like member 84e thereby releasing the shaft 82 from being locked.

In the present embodiment, as shown in FIG. 8, four such brake units 80 are provided so as to be arranged substantially with equal intervals in the circumference direction around the center O of the probe card 20. As from the planar view in the same figure, respective shafts 82 contact respective limit units 90 at inner positions than the top coupling portions 61b of top plates 61. Note that the number of brake units 80 may be four or more and arbitrarily set depending on the magnitude of pressing force F and other factors.

Moreover, the brake units 80 are not particularly limited to the above structure as long as including a member (or mechanism) which is movable relative to the frame 51 or the limit unit 90 and a member (or mechanism) which is capable of transmitting the pressing force F received by the limit unit 90 to the frame 51.

For example as shown in FIG. 9, brake unit 80 may be configured of an air cylinder 85a, and a lock mechanism 85c for grasping the shaft 85b of an air cylinder 85a to lock the shaft 85b.

In addition as shown in FIG. 10, brake unit 80 may be configured of a table lift 86a having a link mechanism, and a lock mechanism 86c for locking the movement of a guide roller 86b of the table lift 86a. Note that both ends of the table lift 86a may be fixed to the frame 51 and the supporting block 92, respectively. Alternatively, one end of the table lift 86a may be made as a free end to be biased by a spring or the like.

Furthermore as shown in FIG. 11, brake unit 80 may be configured of a shaft 87b formed thereon with a thread 87a, a nut 87c to be screwed with the thread 87a, and a screw hole 87d formed in the frame 51 to correspond to the thread 87a. In this case, the thread 87a is screwed into the screw hole 87d, and the shaft 87b is fixed by the nut 87c in the status where the end of the shaft 87b contacts the supporting block 92.

As shown in FIG. 2, the limit units 90 are mounted on the top plate 61 to prohibit (limit) the sleeve 71 of center clamp 70 from moving in the direction of departing from the top plate 61.

As shown in FIG. 2, each limit unit 90 has a main body block 91, a supporting block 92, a shaft 93, an elastic member (not shown), and a lock mechanism (not shown). This limit unit 90 has a substantially identical structure to that of the brake unit 80 with the exception that the limit unit has the supporting block 92, the main body block 91 has a substantially identical structure to that of the main body block 81, and the shaft 93 has a substantially identical structure to that of the shaft 83. Note that four such limit units 90 are also provided, as shown in FIG. 8, so as to be arranged substantially with equal intervals in the circumference direction around the center O of the probe card 20. Also note that the number of limit units 90 may be four or more (eight for example).

The supporting block 92, which intervenes between the top plate 61 and the main body block 91 as shown in FIG. 2, fixes the main body block 91 to the top plate 61. The shaft 82 of each brake unit 80 contacts the upper surface of this supporting block 92.

In the present embodiment, the lock mechanisms of the limit units 90 lock the shafts 93 in the status where the shafts 93 contact the sleeve 71. This limits the sleeve 71 to move upward in the figure.

Functions of the test head 40 according to the present embodiment will be described hereinafter.

As shown in FIG. 2, when the carrier arm 33 presses the semiconductor wafer W to the probe card 20, the pressing force F at the time is transmitted to the sleeve 71 of center clamp 70 via the probe card 20. Such pressing force F (approximately 400 kg, for example) tends to increase in accordance that the probe card 20 comes to be large and/or the number of probe needles 21 increases.

While the sleeve 71 having received such pressing force F is liable to move in the direction of departing from the probe card 20, the movement is limited by the limit units 90. That is, the pressing force F is transmitted from the sleeve 71 to the limit units 90. In addition, because these limit units 90 are fixed to the top plate 61, the pressing force F is transmitted also to the top plate 61.

Now considering that the top plate 61 is mechanically coupled to the head plate 31 of prober 30, the pressing force F may be finally transmitted to the head plate 31 to bend it, and as a consequence the probe card 20 also possibly bends. Particularly in the case that the top plate 61 or the head plate 31 is thin, problems of such bending of the probe card 20 may be ready for occurring significantly. Given the foregoing, there may be considered to increase the stiffness of stiffener 23 in order to suppress the probe card 20 from bending, however, increasing the thickness of stiffener 23 is with limitations.

In contrast, the test head 40 according to the present embodiment comprises the brake units 80 for transmitting this pressing force F to the frame 51 of test head main body 50. According to these brake units 80, the lock mechanisms 84 mounted relative to the frame 51 lock the shafts 82 contacting the supporting blocks 92. Consequently, the pressing force F transmitted to the limit units 90 is further transmitted to the frame 51 via the brake units 80 before being transmitted to the head plate 31.

That is, according to the present embodiment, the pressing force F applied to the probe card 20 is transmitted to the frame 51 of test head main body 50 through the pathway including center clamp 70, limit units 90, and brake units 80 in this order.

In the present embodiment, each of four brake units 80 bears 100 kg or more load and therefore, if the pressing force F is 400 kg or less, the pressing force F is allowed to be transmitted without any loss to the frame 51 of test head main body 50.

In addition, the test head main body 50, which has the weight of approximately 1,000 kg, is capable of sufficiently receiving the pressing force F (approximately 400 kg) applied to the probe card 20.

Thus, the pressing force F is transmitted to the rigid frame 51 via the brake units 80, and as a consequence the head plate 31 is prevented from readily bending and the probe card 20 is accordingly also suppressed from bending. The suppressed bending of the probe card 20 prevents electrical contact failures between the contactors 21 of probe card 20 and DUTs of semiconductor wafer W.

Moreover, according to the present embodiment, the brake units 80 and the limit units 90 are arranged with substantially equal intervals in the circumference direction around the center O of the probe card 20, as shown in FIG. 8. Therefore, the brake units 80 and the limit units 90 may receive the pressing force F applied to the probe card 20 with well-balanced distribution, thereby to effectively suppress the probe card 20 from bending.

Furthermore, according to the present embodiment, the center clamp 70 grasps the clamp head 24 provided at the center portion of the probe card 20 to directly receive the pressing force F to be received by the probe card 20. This allows to respond to the pressing force F regardless of the stiffness of the stiffener 23 thereby being advantageous in cost and handling.

In addition, according to the present embodiment, the shafts 82 of brake units 80 are located at inner side relative to the top coupling portions 61b (nearer the center O), as shown in FIG. 2 and FIG. 8. This ensures that the pressing force F applied to the probe card 20 is transmitted to the frame 51 via the brake units 80 before being transmitted to the head plate 31 via the coupling portions 31b and 61b. This effectively suppress the probe card 20 from bending FIG. 12 to FIG. 15 are cross sectional views illustrating alternative examples of the test head according to the present embodiment.

Figure 12:
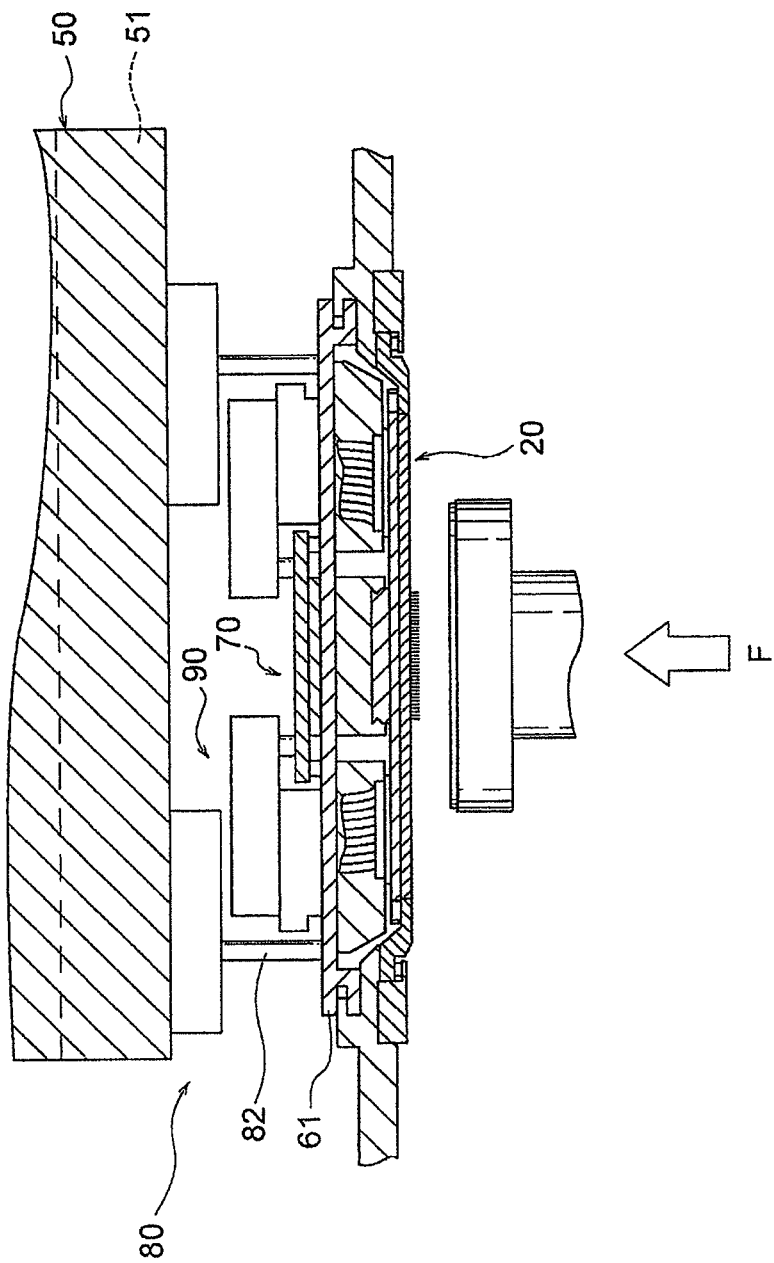
FIG. 12 is a cross sectional view illustrating a first alternative example of the test head according to an embodiment of the present invention.

Although the brake units 80 according to the present embodiment involve the shafts 82 contacting the limit units 90, the present embodiment is not particularly limited to this. For example as shown in FIG. 12, the shafts 82 may be caused to directly contact the top plate 61. In this example, the pressing force F applied to the probe card 20 is transmitted to the frame 51 through the pathway including center clamp 70, limit units 90, top plate 61, and brake units 80 in this order. This may also suppress the probe card 20 from bending similarly to the above.

Figure 13:
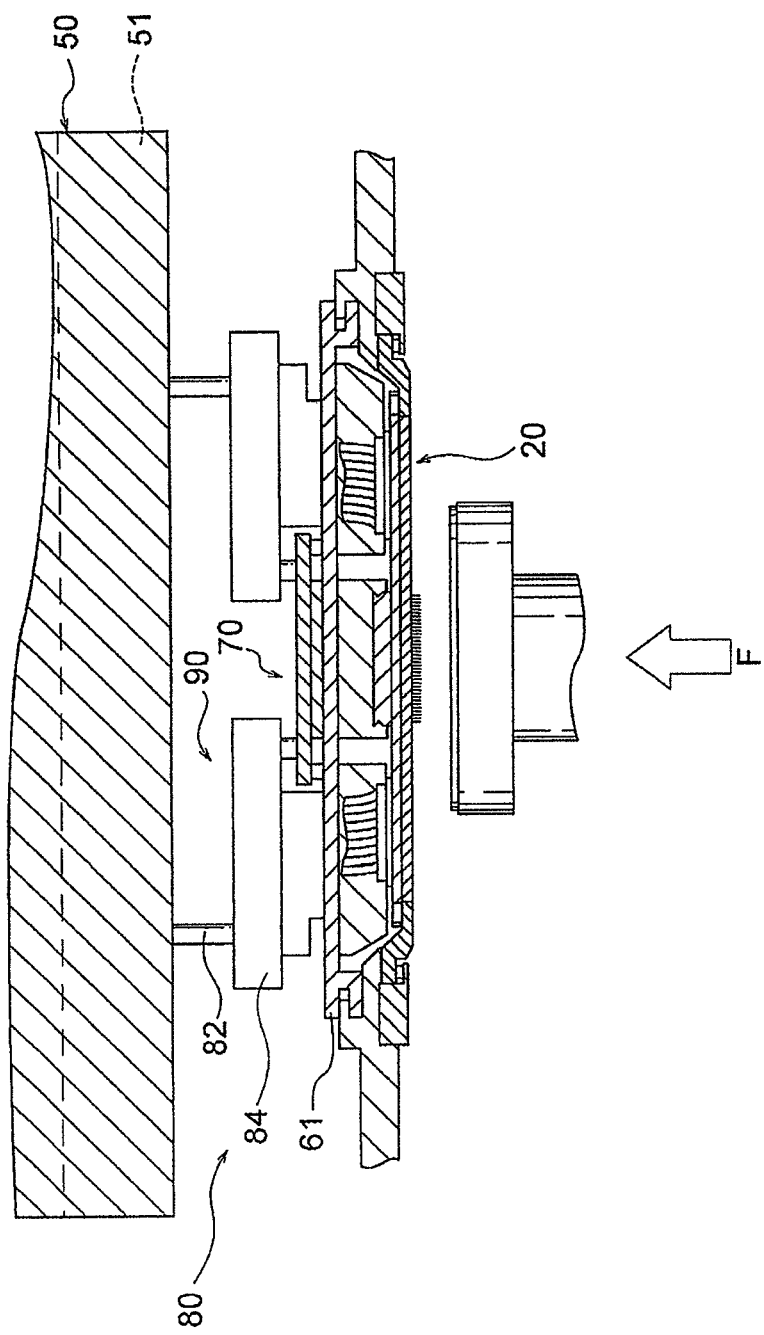
FIG. 13 is a cross sectional view illustrating a second alternative example of the test head according to an embodiment of the present invention.

Note that, although the brake units 80 are attached to the frame 51 and the shafts 82 are caused to contact the limit units 90 in the present embodiment, this relationship may be reversed. For example as shown in FIG. 13, the limit units 90 may be integrally associated with the lock mechanisms 84 to be fixed to the top plate 61, and the shafts 82 may thus be caused to contact the frame 51 of test head main body 50. In this case, the pressing force F applied to the probe card 20 is transmitted to the frame 51 through the pathway including center clamp 70, limit units 90, and brake units 80 in this order. In the alternative example as shown in FIG. 13, the limit units 90 may be omitted.

Figure 14:
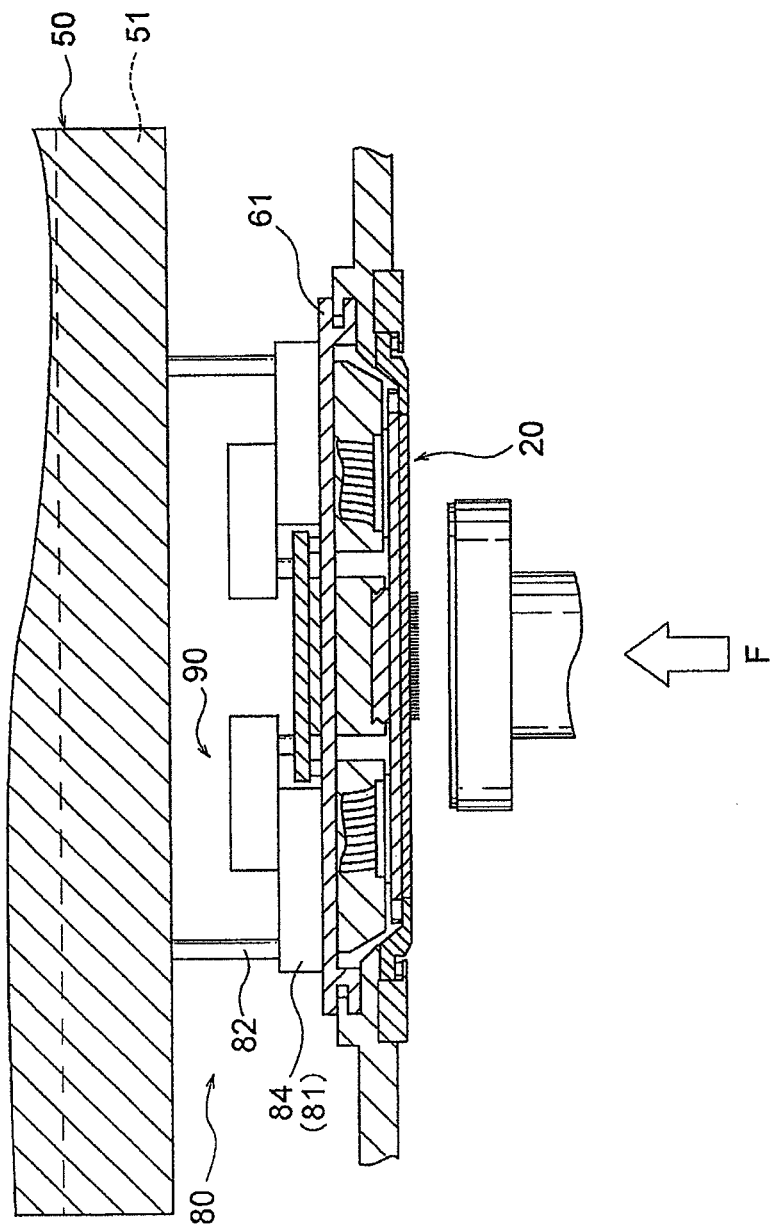
FIG. 14 is a cross sectional view illustrating a third alternative example of the test head according to an embodiment of the present invention.

Also note that, as shown in FIG. 14, the brake units 80 may be attached to the top plate 61 such that the shafts 82 are caused to contact the frame 51 of test head main body 50. Likewise in this case the pressing force F applied to the probe card 20 is transmitted to the frame 51 through the pathway including center clamp 70, limit units 90, and brake units 80 in this order.

Figure 15:
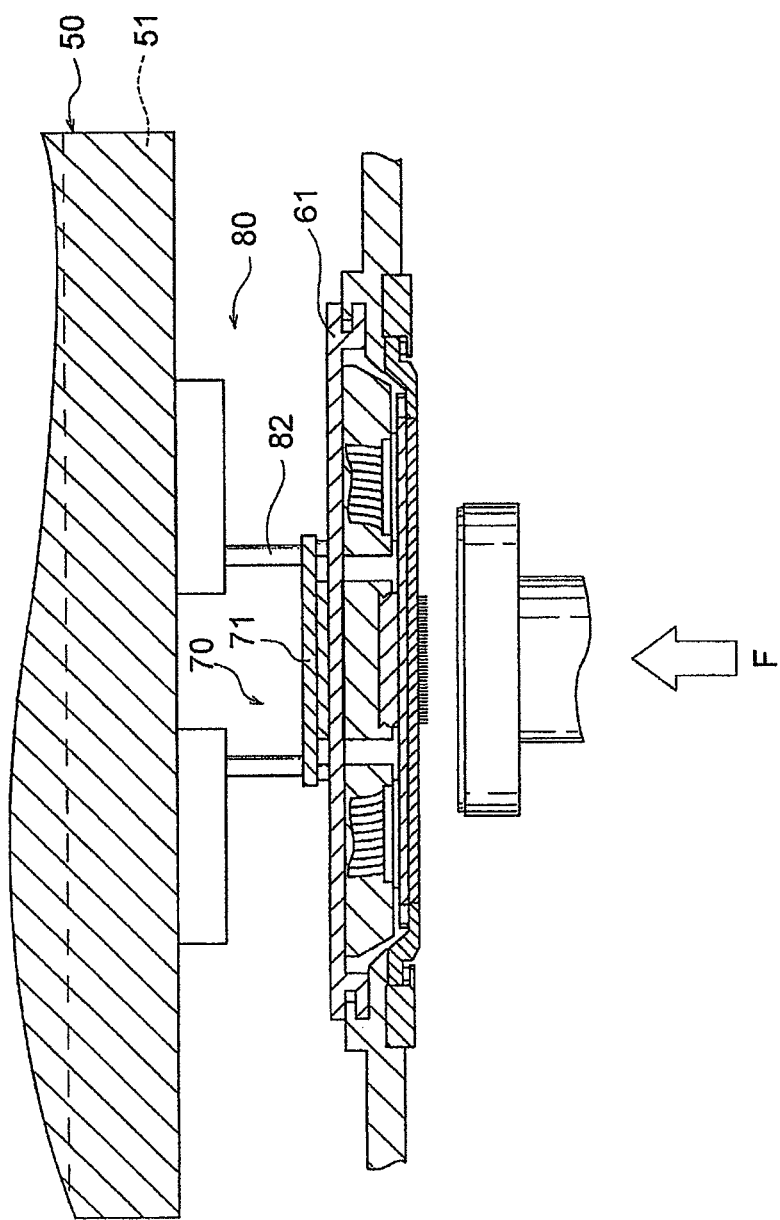
FIG. 15 is a cross sectional view illustrating a fourth alternative example of the test head according to an embodiment of the present invention.

Still also note that, without providing the limit units 90 as shown in FIG. 15, the shafts 82 of brake units 80 may be caused to contact the upper surface of sleeve 71 of the center clamp 70. In this case, the pressing force F applied to the probe card 20 is transmitted to the frame 51 through the pathway including center clamp 70 and brake units 80 in this order. Further alternatively in the alternative example shown in FIG. 15, the brake units 80 may be attached to the center clamp 70 such that the shafts 82 are caused to contact the frame 51 of test head main body 50.

Figure 16:
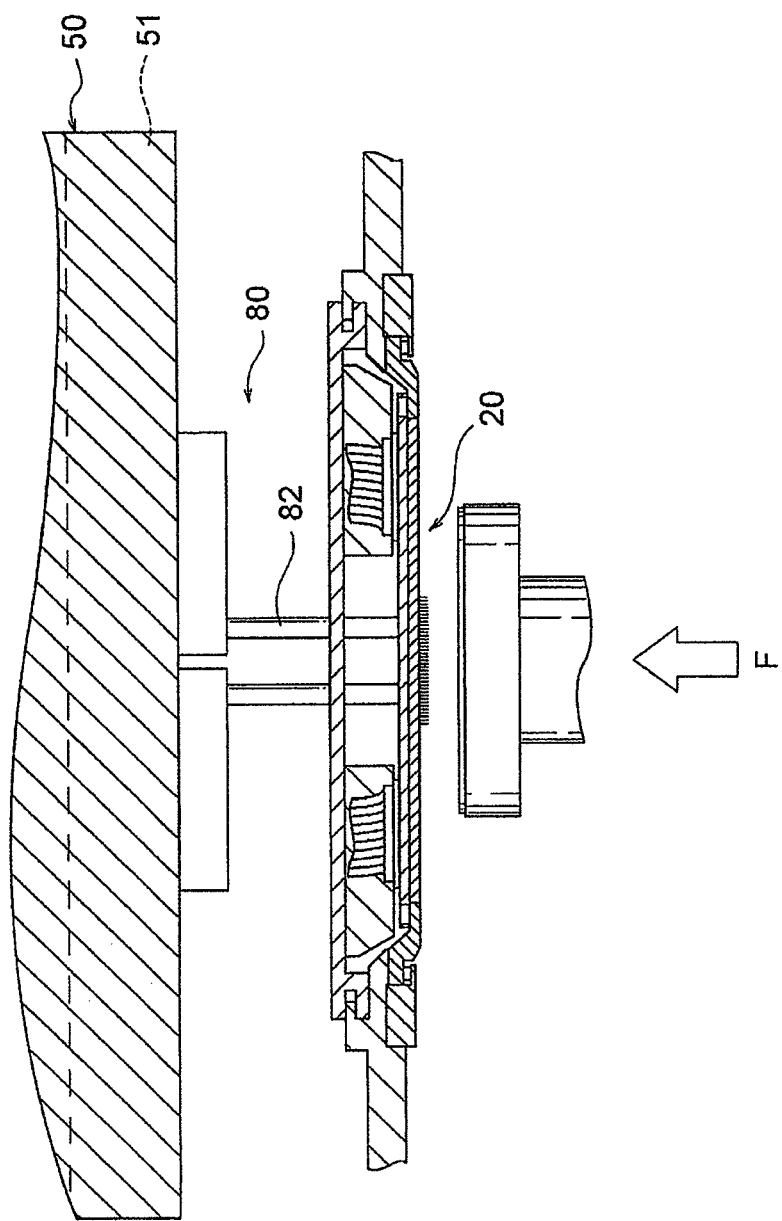
FIG. 16 is a cross sectional view illustrating a fifth alternative example of the test head according to an embodiment of the present invention.

Further note that, without providing the center clamp 70 and the limit units 90 as shown in FIG. 16, the shafts 82 of brake units 80 may be caused to directly contact the center portion of probe card 20. In this case, the pressing force F applied to the probe card 20 is transmitted from the probe card 20 to the frame 51 through only the brake units 80. Thus, the brake units 80 may receive the pressing force F at the center portion of the probe card 20 thereby to more effectively suppress the probe card 20 from bending. In this case, the clamp head may not be provided for the probe card 20 as shown in the same figure.

A method of attaching the probe card 20 according to the present embodiment will be described hereinafter.

Figure 17:
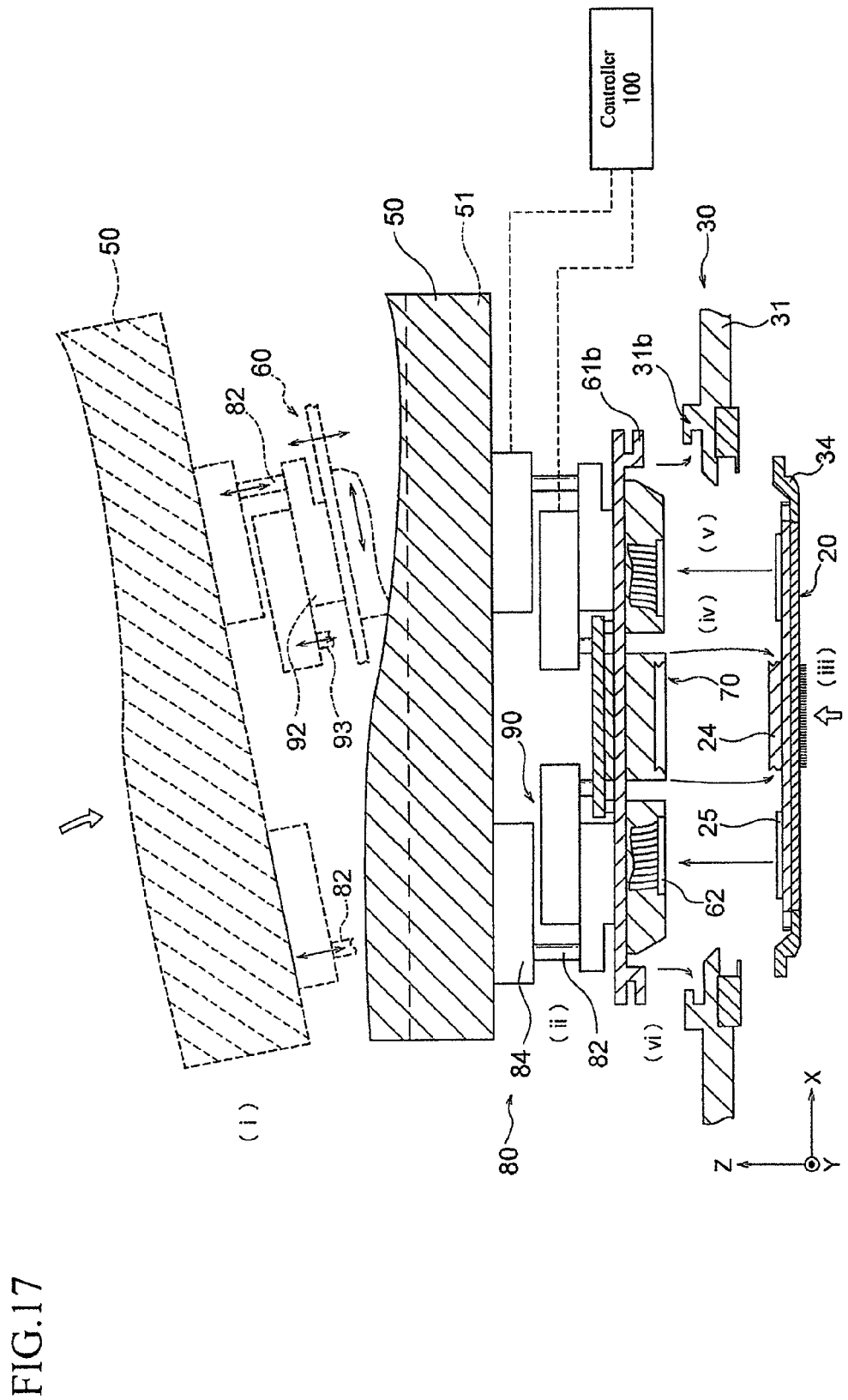
FIG. 17 is an exploded cross sectional view of the test head according to an embodiment of the present invention.
Figure 18:
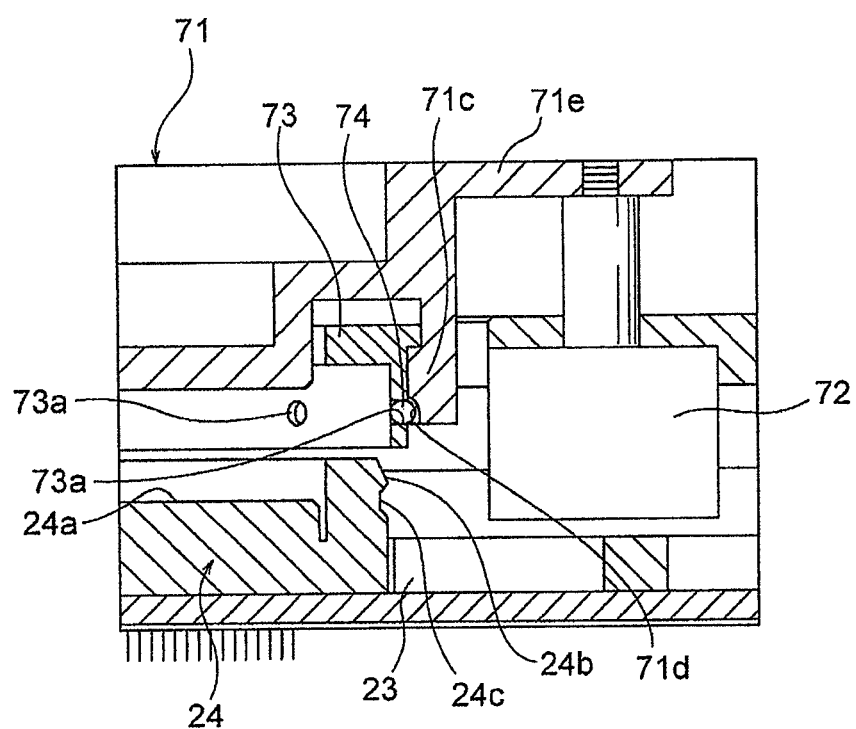
FIG. 18 is an enlarged cross sectional view (part 1) for explaining the operation of a center clamp according to an embodiment of the present invention.
Figure 19:
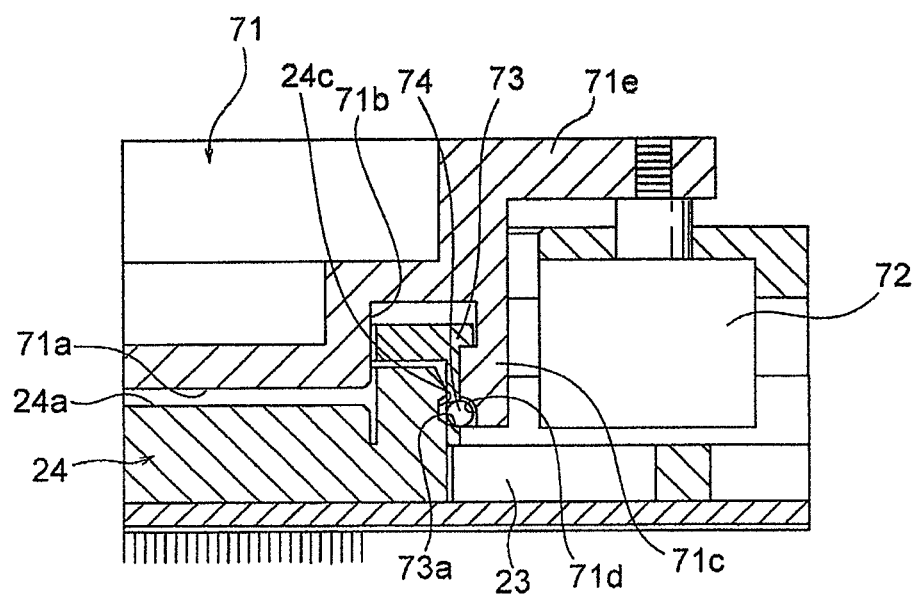
FIG. 19 is an enlarged cross sectional view (part 2) for explaining the operation of the center clamp according to an embodiment of the present invention.

FIG. 17 is an exploded perspective view of the test head according to the present embodiment, and FIG. 18 and FIG. 19 are enlarged cross sectional views for explaining the operation of the center clamp according to the present embodiment.

Initially, the HIFIX 60 having been attached with the center clamp 70 and the limit units 90 is mounted to the test head main body 50 having been attached with the brake units 80. In this status the lock mechanisms 84 of brake units 80 are released from locking, and the relative movement of the shafts 82 is accepted. Likewise, the lock mechanisms of limit units 90 are also released from locking, and the relative movement of the shafts 93 is accepted. Therefore, the mechanical connection between the HIFIX 60 and the test head main body 50 is in a floating status via the springs 64.

Then, as shown in FIG. 1, the test head 40 is moved and reversed to the prober 30 using the manipulator 41 and motor 42.

In this status the relative movement of the shafts 82 is still accepted, and as shown by (i) in FIG. 17, the shafts 82 are capable of following the micromotion of the HIFIX 60. Note that the shafts 82 are merely biased by the elastic member 83 to contact the supporting block 92, and therefore the micromotion of the HIFIX 60 in the planar directions is also accepted. In FIG. 17, the test head main body 50 and components associated therewith during the above moving and reversing are indicated by broken lines.

Then, the test head main body 50 is positioned relative to the prober 30. This positioning of the test head main body 50 is performed, although not shown, by fitting guide pins provided on the prober 30 into respective guide holes formed at the lower surface of the test head main body 50.

Thereafter, the shafts 82 of brake units 80 are locked as shown by (ii) in FIG. 17. In this situation the elastic members 83 bias the shafts 82, and therefore the shafts 82 are locked (fixed) under the condition where the shafts 82 stand to extend between the limit units 90 and the frame 51.

Note that the locking of the shafts 82 may be performed after the coupling portions 31b of the head plate 31 and the coupling portions 61b of the top plate 61 are coupled with one another (after (vi) shown in FIG. 17), as long as being after the moving and reversing of the test head main body 50. Also note that such a control of the brake units 80 (lock mechanisms 84) is performed by a controller 100, as shown in the same figure.

Next, as shown by (iii) in FIG. 17, the probe card 20 having attached to the holder 34 is carried to a position (a height) at which the center clamp 70 may grasp the probe card 20. The carrying of the probe card 20 is performed by an exchanging arm (not shown) within the prober 30.

In turn as shown by (iv) in the same figure, the center clamp 70 holds the clamp head 24 of probe card 20.

More specifically as shown in FIG. 18, the first air cylinder 72 is compressed such that the sleeve 71 comes close to the clamp head 24 thereby causing the steel balls 74 to be pressed out toward the outside of the slide body 73 by means of the taper face 24b of the clamp head 24. This allows the steel balls 74 to be temporarily accommodated between the accommodating holes 73a of slide body 73 and the accommodating groove 71d formed at the rib 71c of sleeve 71.

Thereafter as shown in FIG. 19, the sleeve 71 is caused to further come close to the clamp head 24 such that the end of the slide body 73 contacts the stiffener 23 of the probe card 20. From this situation, if the sleeve 71 is caused to still further come close to the clamp head 24, then the sleeve 71 moves downward relative to the slide body 73, and as a consequence the steel balls 74 are pressed out from the accommodating groove 71d of the rib 71c to be engaged with the engaging groove 24c of clamp head 24 and to ensure that the clamp head 24 is held by the center clamp 70 (refer to FIG. 4).

Then, although not particularly shown, the second air cylinder 75 is compressed after the limit units 90 are locked. This allows the slide body 73 to be lifted up relative to the sleeve 71, resulting in that the contact positions between the steel balls 74 and the engaging groove 24c relocates from the approximate middle area of the engaging groove 24c to the upper area of the engaging groove 24c, and as a consequence the sleeve contact surface 71a and the clamp contact surface 24a come to close contact with each other. Note that the control of the first and second air cylinders 72 and 75 and the limit units 90 is performed by the controller 100 shown in FIG. 17.

Next, as shown by (v) in FIG. 17, the connectors 25 provided for the probe card 20 and the connectors 62 of the HIFIX 60 are connected to one another thereby electrically connecting the HIFIX 60 and the probe card 20.

Then, as shown by (vi) in FIG. 17, the coupling portions 31b of the head plate 31 and the coupling portions 61b of the top plate 61 are engaged with one another to fix the HIFIX 60 to the head plate 31 of prober 30.

As described hereinbefore, according to the present embodiment, the lock mechanisms 84 of brake units 80 accept the relative movement of the shafts 82 before the positioning of the test head main body 50, and the lock mechanisms 84 locks the relative movement of the shafts 82 after the positioning of the test head main body 50. For this reason, every time the test head 40 is caused to dock with the prober 30 in association with maintenance, component replacement, and the like, the shafts 82 are to be newly fixed in the condition where the shafts 82 stand to extend between the HIFIX 60 and the test head main body 50, and therefore the pressing force F applied to the probe card 20 is ensured to be transmitted to the frame 51 even if the space between the HIFIX 60 and the test head main body 50 changes.

It is to be noted that the embodiments as explained above are described to facilitate understanding of the present invention and are not described to limit the present invention. Therefore, it is intended that the elements disclosed in the above embodiments include all substitutions, modifications and equivalents to fall within the technical scope of the present invention.

DESCRIPTION OF REFERENCE NUMERALS

1 . . . semiconductor wafer test apparatus
10 . . . tester
20 . . . probe card
24 . . . clamp head
30 . . . prober
31 . . . head plate
31b . . . head coupling portion
40 . . . test head
50 . . . test head main body
51 . . . frame
60 . . . HIFIX (interface apparatus)
61 . . . top plate
61b . . . top coupling portion
70 . . . center clamp (holding mechanism)
71 . . . sleeve
80 . . . brake unit (transmitting means)
81 . . . main body block
82 . . . shaft (contact part)
83 . . . elastic member (biasing means)
84 . . . lock mechanism
90 . . . limit unit (limiting means)

The invention claimed is:

1. A test head comprising:
a test head main body having a frame; and
an interface apparatus electrically connecting a probe card and the test head main body with each other and a stiffener that reinforces the probe card, wherein
the test head further comprises:
a transmitter positioned between the probe card and the frame and configured to transmit a pressing force applied to the probe card to the frame;
a holding mechanism provided at a top plate of the interface apparatus and configured to hold the probe card; and
a limiter provided at the top plate and configured to limit a movement of the holding mechanism in a direction departing from the probe card reinforced by the stiffener, wherein
the transmitter has:
a contact member being movable relative to either one of the limiter or the frame and contacting other of the limiter or the frame; and
a lock mechanism provided at either one of the limiter or the frame and configured to lock a relative movement of the contact member.

2. The test head as set forth in claim 1, wherein
the holding mechanism grasps a clamp head provided at a center portion of the probe card.

3. The test head as set forth in claim 1, wherein
the top plate has a coupling portion which is to be coupled with a head plate of a prober,
a center of the probe card is nearer to the contact member than the coupling portion with respect to a planar view.

4. The test head as set forth in claim 1, wherein
the transmitter has a biasing member that biases the contact member.

5. The test head as set forth in claim 1, wherein
the lock mechanism accepts a relative movement of the contact member before the test head main body is positioned relative to a prober, and the lock mechanism locks the relative movement of the contact member after the test head main body is positioned relative to the prober.

6. A test head comprising:
a test head main body having a frame; and
an interface apparatus electrically connecting a probe card and the test head main body with each other and a stiffener that reinforces the probe card, wherein
the test head further comprises:
a holding mechanism provided at a top plate of the interface apparatus and configured to hold the probe card;
a limiter provided at the top plate and configured to limit a movement of the holding mechanism in a direction departing from the probe card reinforced by the stiffener; and
a transmitter configured to transmit a pressing force applied to the probe card to the frame, the transmitter having:
a contact member being movable relative to either one of the top plate or the frame and contacting other of the top plate or the frame; and
a lock mechanism provided at either one of the top plate or the frame and configured to lock a relative movement of the contact member.

7. The test head as set forth in claim 6, wherein
the holding mechanism grasps a clamp head provided at a center portion of the probe card.

8. The test head as set forth in claim 6, wherein
the top plate has a coupling portion which is to be coupled with a head plate of a prober,
a center of the probe card is nearer to the contact member than the coupling portion with respect to a planar view.

9. The test head as set forth in claim 6, wherein
the transmitter has a biasing member that biases the contact member.

10. The test head as set forth in claim 6, wherein
the lock mechanism accepts a relative movement of the contact member before the test head main body is positioned relative to a prober, and the lock mechanism locks the relative movement of the contact member after the test head main body is positioned relative to the prober.

11. A semiconductor wafer test apparatus comprising:
the test head as set forth in claim 6; and
a prober pressing a semiconductor wafer to the probe card.

12. A test head comprising:
a test head main body having a frame; and
an interface apparatus electrically connecting a probe card and the test head main body with each other and a stiffener that reinforces the probe card, wherein
the test head further comprises:
a holding mechanism provided at a top plate of the interface apparatus and configured to hold the probe card;
a limiter provided at the top plate and configured to limit a movement of the holding mechanism in a direction departing from the probe card reinforced by the stiffener; and
a transmitter configured to transmit a pressing force applied to the probe card to the frame, the transmitter having:
a contact member being movable relative to either one of the holding mechanism or the frame and contacting other of the holding mechanism or the frame; and
a lock mechanism provided at either one of the holding mechanism or the frame and configured to lock a relative movement of the contact member.

13. The test head as set forth in claim 12, wherein
the holding mechanism grasps a clamp head provided at a center portion of the probe card.

14. The test head as set forth in claim 12, wherein
the top plate has a coupling portion which is to be coupled with a head plate of a prober,
a center of the probe card is nearer to the contact member than the coupling portion with respect to a planar view.

15. The test head as set forth in claim 12, wherein
the transmitter has a biasing member that biases the contact member.

16. The test head as set forth in claim 12, wherein
the lock mechanism accepts a relative movement of the contact member before the test head main body is positioned relative to a prober, and the lock mechanism locks the relative movement of the contact member after the test head main body is positioned relative to the prober.

* * * * *